United States Patent
Yamasaki (10) Patent No.: US 7,372,885 B2
(45) Date of Patent: May 13, 2008

(54) SEMICONDUCTOR LASER DEVICE AND OPTICAL INFORMATION RECORDING APPARATUS PROVIDED THEREWITH

(75) Inventor: Yukio Yamasaki, Shijyonawate (JP)

(73) Assignee: Sharp Kabushiki Kaisha, Osaka (JP)

( * ) Notice: Subject to any disclaimer, the term of this patent is extended or adjusted under 35 U.S.C. 154(b) by 139 days.

(21) Appl. No.: 11/304,689

(22) Filed: Dec. 16, 2005

(65) Prior Publication Data

US 2006/0133439 A1  Jun. 22, 2006

(30) Foreign Application Priority Data

Dec. 17, 2004  (JP)  ............... 2004-365431
Sep. 30, 2005  (JP)  ............... 2005-286889

(51) Int. Cl.
*H01S 5/00* (2006.01)

(52) U.S. Cl. .................. 372/44.01; 372/43.01

(58) Field of Classification Search ............. 372/43.01, 372/45.01

See application file for complete search history.

(56) References Cited

U.S. PATENT DOCUMENTS 5,604,762 A * 2/1997 Morinaga et al. ........ 372/43.01

2001/0009558 A1 * 7/2001 Shigihara .................. 372/45
2006/0007976 A1 * 1/2006 Watanabe et al. ....... 372/46.01

FOREIGN PATENT DOCUMENTS

JP  2000-124552  4/2000

* cited by examiner

*Primary Examiner*—Michael Dung Nguyen
(74) *Attorney, Agent, or Firm*—Harness, Dickey & Pierce, P.L.C.

(57) ABSTRACT

A semiconductor laser device that offers higher coupling efficiency to a pickup optical system by dramatically reducing the amount of difference between the shape of an FFP in the vertical direction and a Gaussian shape, and that can be produced at lower cost by reducing the operating power needed. The semiconductor laser device is provided with a negative electrode, a GaN substrate, a first n-type clad layer, an n-type light shielding layer that shields light, a second n-type clad layer, an n-type optical waveguide layer, a first carrier stop layer, an active layer, a second carrier stop layer, a p-type optical waveguide layer, a p-type clad layer, a p-type contact layer, and a positive electrode laid in this order.

14 Claims, 7 Drawing Sheets

SEMICONDUCTOR LASER DEVICE AND OPTICAL INFORMATION RECORDING APPARATUS PROVIDED THEREWITH

This nonprovisional application claims priority under 35 U.S.C. § 119(a) on Patent Applications Nos. 2004-365431 filed in Japan on Dec. 17, 2004 and 2005-286889 filed in Japan on September 30, respectively, the entire contents of which are hereby incorporated by reference.

BACKGROUND OF THE INVENTION

1. Field of the Invention

The present invention relates to a semiconductor laser device and an optical information recording apparatus provided therewith, and more particularly to a semiconductor laser device having a Gaussian-like far-field pattern in the vertical direction and an optical information recording apparatus provided therewith.

2. Description of Related Art

There have been fabricated prototypes of semiconductor laser devices that emit light in a region ranging from blue to ultraviolet by the use of a nitride semiconductor material as exemplified by GaN, InN, AlN, and mixed crystal semiconductors thereof (see Applied Physics Letters 69, pp. 4056-4058). This semiconductor laser device has the following layers laid one on top of another in the order mentioned on an n-type GaN layer (3 μm): an n-type $In_{0.05}Ga_{0.95}N$ buffer layer, an n-type $Al_{0.05}Ga_{0.95}N$ clad layer (0.5 μm), an n-type GaN optical waveguide layer (0.1 μm), an $In_{0.2}Ga_{0.8}N$/n-type $In_{0.05}Ga_{0.95}N$ triple quantum well active layer ($In_{0.2}Ga_{0.8}N$/n-type $In_{0.05}Ga_{0.95}N$=40 Å/80 Å×3MQW), a p-type $Al_{0.2}Ga_{0.8}N$ layer (200 Å), a p-type GaN optical waveguide layer (0.1 μm), a p-type $Al_{0.05}Ga_{0.95}N$ clad layer (0.5 μm), and a p-type GaN contact layer (0.2 μm). Part of the active layer is etched, from the topmost surface thereof down to the p-type $Al_{0.05}Ga_{0.95}N$ clad layer so as to leave a ridge-shaped stripe with a width of 2 μm, and then, on top thereof, an electrode is formed. This semiconductor laser device has an optical waveguide structure in which the active layer and the optical waveguide layer are sandwiched between the clad layers. Light emitted from the active layer is confined within the optical waveguide structure, and lasing occurs.

However, the above-described conventional semiconductor laser device has the following problem. When the inventors of the present invention produced the above-described semiconductor laser device and examined the shape of a far-field pattern (FFP) in the vertical direction, they found out that the intensity at a base portion of the FFP thus obtained was higher than that of a Gaussian fitting curve. This leads to lower coupling efficiency at which a semiconductor laser device having such an FFP is coupled to a pickup optical system, because, when light emerging from a semiconductor laser device is coupled to a pickup optical system, only light within the range of angles at which light intensity is several tens percent or more of the peak FFP intensity is used, and light at angles at which light intensity is lower is not used. Therefore, the semiconductor laser device needs to be operated at an increased operating optical output, making it necessary to meet stricter specifications, resulting in lower yield and higher cost. Accordingly, it is necessary to reduce the light intensity at a base portion of the FFP. In other words, it is necessary to make an FFP shape closer to a Gaussian shape.

To make an FFP in the vertical direction closer to a Gaussian shape, in another example of the conventional semiconductor laser device, a so-called graded structure is proposed in which the refractive index is continuously varied from a clad layer to an active layer. This graded structure can be produced, through crystal growth, by substantially continuously varying the mixed crystal ratio of a semiconductor.

On the other hand, in still another example of the conventional semiconductor laser device, there is proposed a structure in which a clad layer or an optical waveguide layer is composed of two or more layers of different refractive indices so distributed as to be increasingly high toward an active layer. This structure too makes the shape of an FFP in the vertical direction closer to a Gaussian shape with the same effect as the graded structure described above.

However, we have examined these two structures described above and have found out that both are only marginally effective at making the shape of an FFP in the vertical direction closer to a Gaussian shape, and the effect is not dramatic.

As described above, in the conventional semiconductor laser device, the shape of an FFP in the vertical direction greatly differs from a Gaussian shape, and coupling efficiency to a pickup optical system is low. This increases an operating optical output at which the semiconductor laser device needs to be operated, making it necessary to meet stricter specifications. This results in lower yield and higher cost.

SUMMARY OF THE INVENTION

It is an object of the present invention to provide a semiconductor laser device that offers higher coupling efficiency to a pickup optical system by dramatically reducing the amount of difference between the shape of an FFP in the vertical direction and a Gaussian shape, and that can be produced at lower cost by reducing the operating power needed. Another object of the present invention is to provide a more inexpensive optical information recording apparatus by using such a semiconductor laser device.

To achieve the above object, according to one aspect of the present invention, a semiconductor laser device has a structure in which a light shielding layer, a first conductivity-type clad layer, an active layer, and a second conductivity-type clad layer are laid in this order from a substrate side.

The semiconductor laser device may have a structure in which a first conductivity-type clad layer, an active layer, a second conductivity-type clad layer, and a light shielding layer are laid in this order from a substrate side.

The above two structures may be combined so that the semiconductor laser device has a structure in which a first light shielding layer, a first conductivity-type clad layer, an active layer, a second conductivity-type clad layer, and a second light shielding layer are laid in this order from a substrate side.

With these structures, the amount of difference between the shape of an FFP in the vertical direction and a Gaussian shape is dramatically reduced.

Preferably, the first conductivity-type clad layer and the second conductivity-type clad layer contain Al, and the active layer contains In.

Preferably, the difference in the Al mixed crystal ratio between the first conductivity-type clad layer and the second conductivity-type clad layer is within 1%.

Preferably, the optical refractive index of the light shielding layer is 0.01 or more smaller than the optical refractive index of the first conductivity-type clad layer or the second conductivity-type clad layer.

Preferably, the optical absorption coefficient of the light shielding layer is 10000 cm$^{-1}$ or more.

Preferably, the distance between the light shielding layer located to face a principal surface of the first conductivity-type clad layer different from an active layer side principal surface and the active layer side principal surface of the first conductivity-type clad layer, and the distance between the light shielding layer located to face a principal surface of the second conductivity-type clad layer different from an active layer side principal surface and the active layer side principal surface of the second conductivity-type clad layer is 0.01 μm or more but 1.5 μm or less.

The lower limit of the above distance range is so defined as to prevent θ⊥ from becoming too great, and the upper limit thereof is so defined as to keep the minimum distance required for the light shielding layer to produce the intended effect.

Preferably, the layer thickness of the light shielding layer is 0.01 μm or more but 3 μm or less.

When the layer thickness of the light shielding layer is 0.01 μm or more, the light shielding layer can produce the intended effect, and when the layer thickness thereof is 3 μm or less, the growth thereof is possible.

Preferably, the light shielding layer is an insulating layer, a metal layer, or an air layer.

Preferably, the light shielding layer is formed of one of $SiO_2$, $ZrO_2$, $Al_2O_3$, SiN, $Al_xGa_{1-x}N$ ($0<x\leq1$), $Al_yGa_{1-y}As$ ($0<y\leq1$), and $Al_zGa_{1-z}P$ ($0<z\leq1$).

Used as the light shielding layer located to face a principal surface of the second conductivity-type clad layer different from an active layer side principal surface may be a second conductivity-type electrode.

Preferably, a first carrier stop layer containing Al is formed between the first conductivity-type clad layer and the active layer, and a second carrier stop layer containing Al is formed between the second conductivity-type clad layer and the active layer.

Preferably, the part from the first conductivity-type clad layer to the second conductivity-type clad layer is symmetric in terms of the refractive index distribution with respect to the central plane of the active layer.

According to another aspect of the present invention, an optical information recording apparatus is provided with the semiconductor laser device described above.

According to the present invention, by forming a light shielding layer between appropriate layers, it is possible to dramatically reduce the amount of difference between the shape of an FFP in the vertical direction and a Gaussian shape, thus increase the coupling efficiency to a pickup optical system, thus reduce the operating power needed, and thus realize a semiconductor laser device at lower cost.

Moreover, according to the present invention, by using the semiconductor laser device described above, it is possible to realize a more inexpensive optical information recording apparatus.

DETAILED DESCRIPTION OF PREFERRED EMBODIMENTS

It is to be noted that, in the present specification, a "vertical direction" denotes a layer growth direction of a semiconductor. In the present specification, the "amount of difference from a Gaussian" denotes a value indicating the degree to which the shape of an FFP differs from a Gaussian shape. Suppose that the FFP is represented as FFP (θ), and a Gaussian function that fits data observed at 40 percent or more of the peak intensity of FFP (θ) is called FIT (θ). Then, the amount of difference from a Gaussian is given by the following formula:

(the amount of difference from a Gaussian)=$\{\int|FFP(\theta)-FIT(\theta)|d\theta\}/\{\int FFP(\theta)d\theta\}$ Here, FIT (θ) is obtained as follows. From a set of data {θ, FFP (θ)} observed at 0.1° intervals over the range including at least −40°≦θ≦40°, only a set of data observed at 65 percent or more of the peak intensity of FFP (θ) is extracted so as to define a new set of data {θ, ln [FFP(θ)]}. Then, a quadratic function $y=a\theta^2+b\theta+c$ that fits the data set thus defined by using a least squares approximation method. By using the coefficients a, b, and c thus obtained, FIT (θ) is expressed as follows.

FIT(θ)=exp [y]

Figure 1:
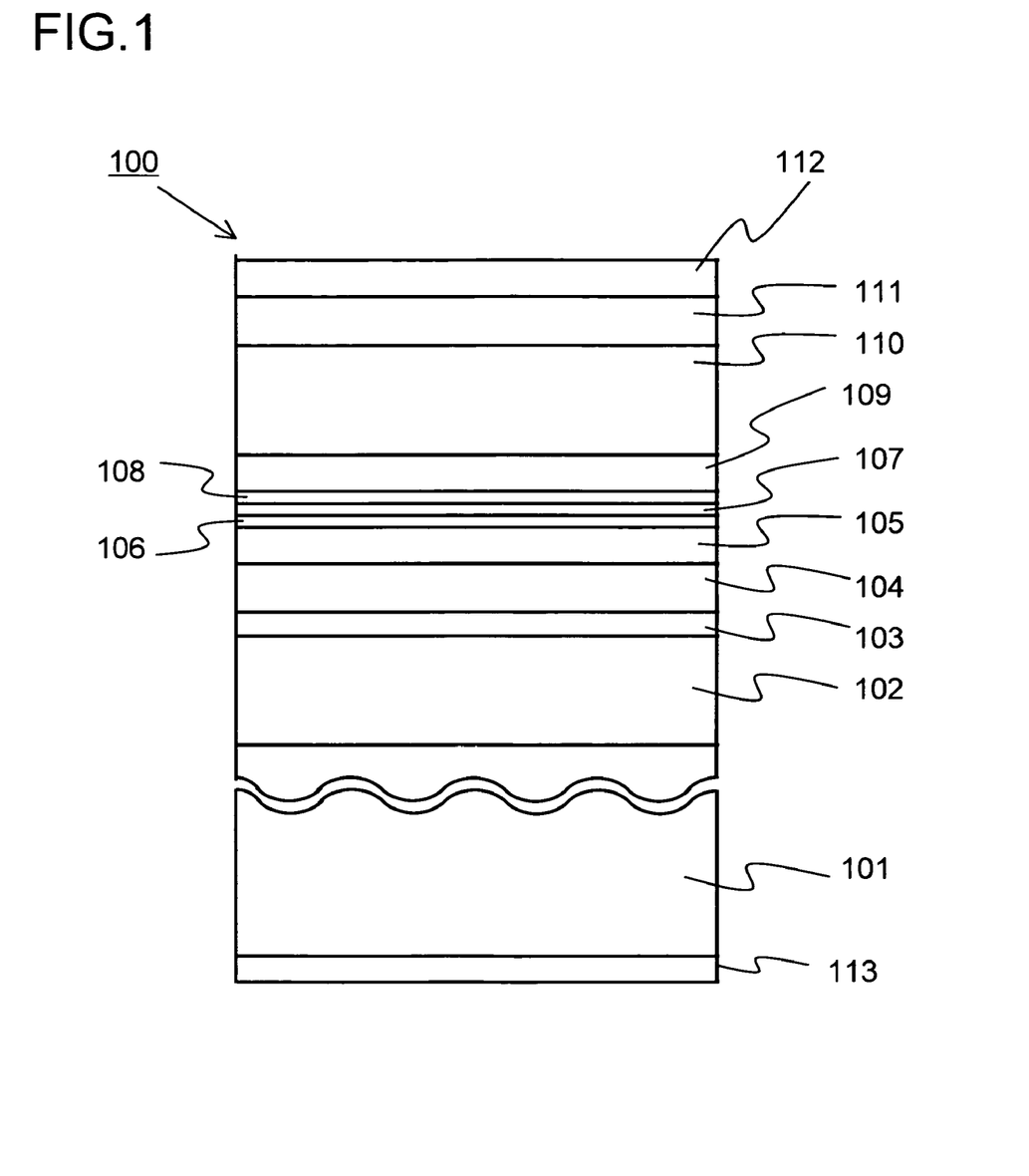
FIG. 1 is a schematic sectional diagram showing the structure of the semiconductor laser device.

FIG. 1 is a schematic sectional diagram showing the structure of a semiconductor laser device 100 of the present invention. FIG. 1 shows the semiconductor laser device 100 sectioned in the direction perpendicular to the direction of the resonator.

The semiconductor laser device 100 has the following layers laid one on top of another in the order mentioned on a GaN substrate 101: a first n-type clad layer 102 of n-type AlGaN, an n-type light shielding layer (a first conductivity-type light shielding layer) 103 that shields light, a second n-type clad layer (a first conductivity-type clad layer) 104 of n-type AlGaN, an n-type optical waveguide layer 105 of n-type GaN, a first carrier stop layer 106 of n-type AlGaN, an active layer 107 of AlInGaN, a second carrier stop layer 108 of p-type AlGaN, a p-type optical waveguide layer 109 of p-type GaN, a p-type clad layer (a second conductivity-type clad layer) 110 of p-type AlGaN, a p-type contact layer 111 of p-type GaN, and a positive electrode 112. On the other hand, there is formed a negative electrode 113 on that surface of the GaN substrate 101 which is located opposite to where the first n-type clad layer 102 is formed.

Alternatively, for example, the first n-type clad layer 102 may be formed of n-type $Al_{0.061}GaN$, the light shielding layer 103 may be formed of n-type $Al_{0.2}GaN$, the second n-type clad layer 104 may be formed of n-type $Al_{0.061}GaN$, the n-type optical waveguide layer 105 may be formed of n-type GaN, the first carrier stop layer 106 may be formed of n-type $Al_{0.3}GaN$, the active layer 107 may be formed as a multiquantum well active layer of InGaN/InGaN, the second carrier stop layer 108 may be formed of p-type $Al_{0.3}GaN$, the p-type optical waveguide layer 109 may be formed of p-type GaN, the p-type clad layer 110 may be formed of p-type $Al_{0.061}GaN$, and the p-type contact layer 111 may be formed of p-type GaN.

Here, the positive electrode (a second conductivity-type electrode) 112 also functions as a p-type light shielding layer (a second conductivity-type light shielding layer). Note that, between the p-type clad layer (a second conductivity-type clad layer) 110 and the p-type contact layer 111, or between the p-type contact layer 111 and the positive electrode 112, there may be formed a p-type light shielding layer (a second conductivity-type light shielding layer).

The first carrier stop layer 106 and the second carrier stop layer 108 contain at least Al. The second carrier stop layer 108 is so formed as to prevent electrons injected from the n-type semiconductor layer side into the active layer 107 from overflowing into the p-type semiconductor layer side. Al contained in the second carrier stop layer 108 acts as a barrier to the electrons. The reason that the first carrier stop layer 106 contains Al here is that this makes the part from the first conductivity-type clad layer to the second conductivity-type clad layer symmetric in terms of the refractive index distribution with respect to the central plane of the active layer, and reduces the amount of difference from a Gaussian.

On the other hand, the second n-type clad layer 104 and the p-type clad layer 110 contain Al, and the active layer 107 contains In. The presence of these elements there makes it possible to form a refractive index distribution in the layer thickness direction, thus increase the optical density of the active layer 107, and thus permit effective lasing to occur.

It is to be noted that the present invention requires only a substrate, an n-type clad layer, an active layer, a p-type clad layer, and a light shielding layer. For example, p-type/n-type optical waveguide layers, first/second carrier stop layers, and the like can be omitted as required, because they are not essentials of the present invention. Moreover, in the embodiment described above, a substrate of GaN is used; in practice, however, a substrate of sapphire, for example, may be used instead. Furthermore, an active layer adopts a multiquantum well structure of InGaN/InGaN; in practice, however, an active layer may adopt a multiquantum well structure of InGaN/GaN, a multiquantum well structure of GaN/AlGaN, or a single quantum well structure.

Figure 2:
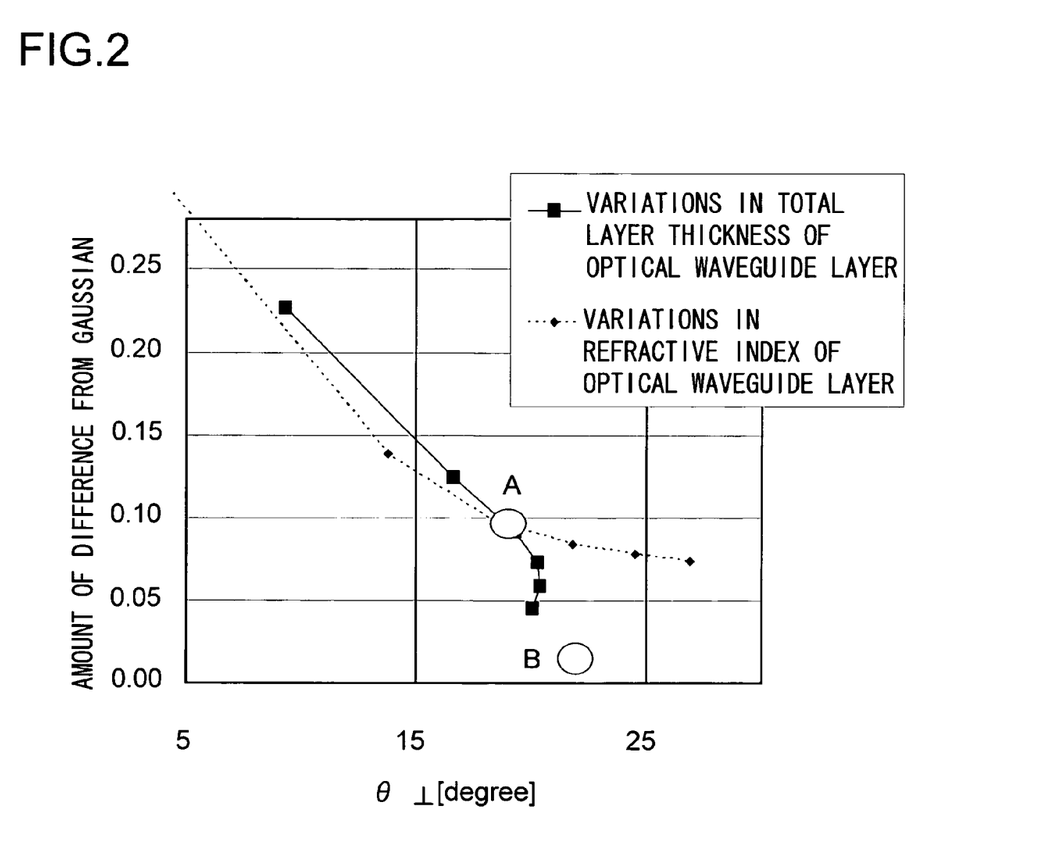
FIG. 2 is a diagram showing the structural parameter dependence of the amount of difference between an FFP in the vertical direction and a Gaussian.

FIG. 2 shows the structural parameter dependence of the amount of difference between an FFP in the vertical direction and a Gaussian. Point A indicates the amount of difference between an FFP in the vertical direction and a Gaussian in the conventional semiconductor laser device, and point B indicates the amount of difference between an FFP in the vertical direction and a Gaussian in the semiconductor laser device 100 of the present invention. The solid line indicates a state where the total layer thickness of the optical waveguide layer of the conventional semiconductor laser device is varied, and the broken line indicates a state where the refractive index of the optical waveguide layer of the conventional semiconductor laser device is varied. As is obvious from the drawing showing the solid line and the broken line, the greater the full angle at half maximum $\theta\perp$ of the FFP in the vertical direction, the smaller the amount of difference from a Gaussian.

In the conventional semiconductor laser device, when the refractive index of the optical waveguide layer is increased, the amount of difference from a Gaussian tends to converge to a value of about 0.06, and stays there. On the other hand, $\theta\perp$ still increases, making the ellipticity defined as $\theta\perp/\theta//$ degraded. This decreases the coupling efficiency to a pickup optical system, and therefore it is undesirable from a practical standpoint.

Moreover, in the conventional semiconductor laser device, when the total layer thickness of the optical waveguide layer is increased, the amount of difference from a Gaussian tends to decrease. However, when the total layer thickness of the optical waveguide layer is increased beyond point A, the optical confinement factor of the active layer tends to decrease. This increases a threshold current, i.e., an operating current, and therefore it is undesirable from a practical standpoint.

On the other hand, in the semiconductor laser device 100, as indicated by point B, the amount of difference from a Gaussian is reduced dramatically to a value as small as about 0.01, and the optical confinement factor of the active layer observed at point A is achieved.

Figure 3A:
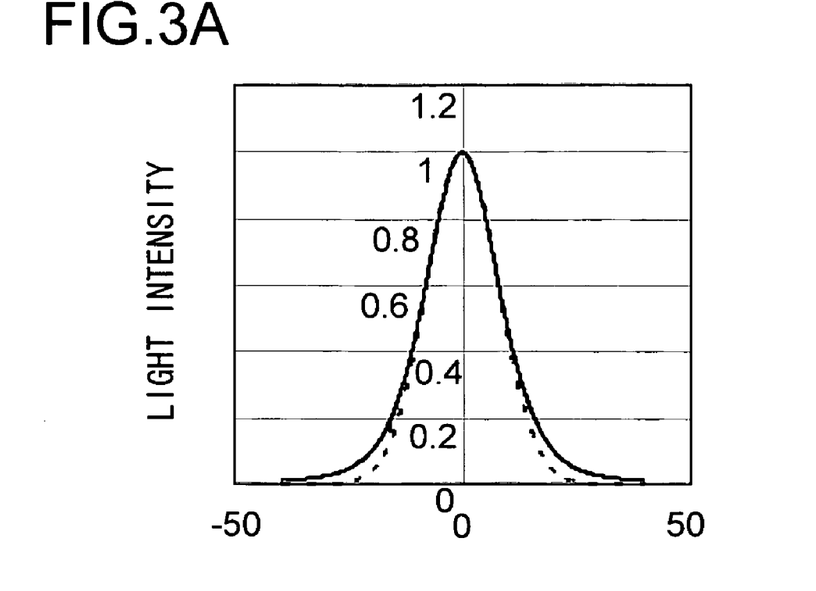
FIG. 3A is a diagram showing the FFP in the vertical direction of a conventional semiconductor laser device and a Gaussian fitting curve.
Figure 3B:
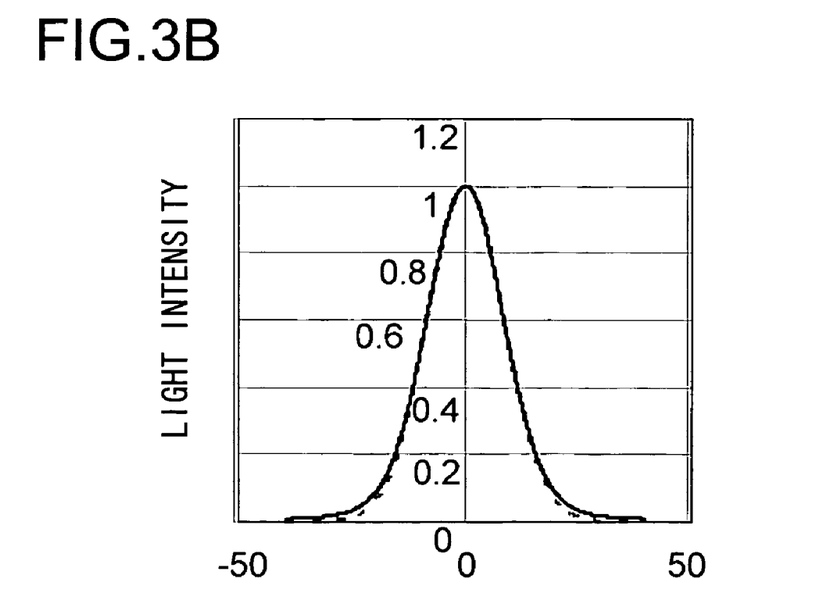
FIG. 3B is a diagram showing the FFP in the vertical direction of the semiconductor laser device of the present invention and a Gaussian fitting curve.

FIG. 3A is a diagram showing the FFP in the vertical direction of the conventional semiconductor laser device and a Gaussian fitting curve. In this drawing, the FFP in the vertical direction of the conventional semiconductor laser device is indicated by a solid line, and the Gaussian fitting curve is indicated by a broken line. The light intensity at a base portion of the FFP in the vertical direction is higher than that of the Gaussian fitting curve. FIG. 3B is a diagram showing the FFP in the vertical direction of the semiconductor laser device 100 and a Gaussian fitting curve. The FFP in the vertical direction of the semiconductor laser device 100 is indicated by a solid line, and the Gaussian fitting curve is indicated by a broken line. As seen in the drawings, the light intensity at the base portion of the FFP in the vertical direction of the semiconductor laser device 100 is dramatically reduced as compared with that observed in the conventional semiconductor laser device.

Figure 4A:
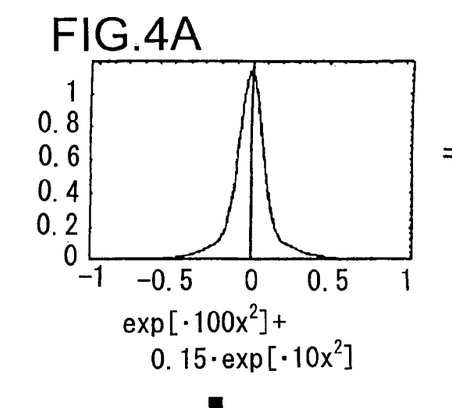
FIG. 4 shows the results of calculation of the optical electric field distribution in the optical waveguide by simulation.
Figure 4B:
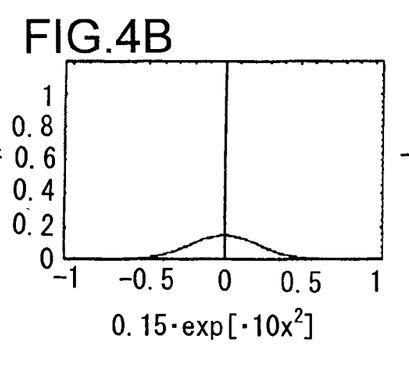
Figure 4C:
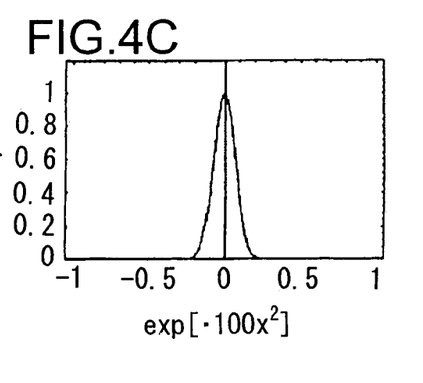
Figure 4D:
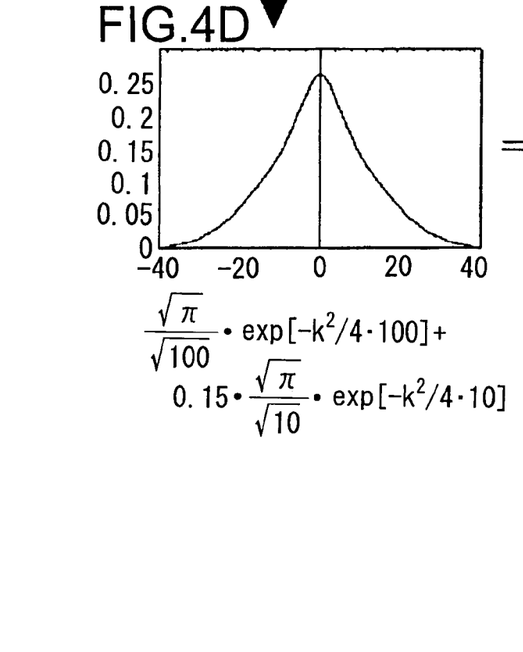
Figure 4E:
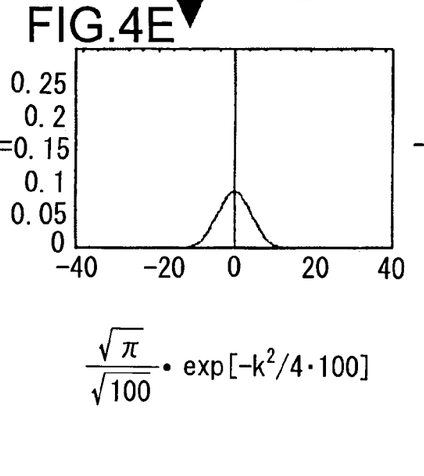
Figure 4F:
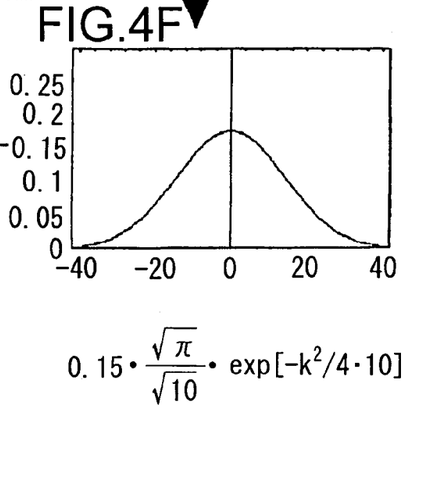

Next, the effect of the light shielding layer of the present invention will be described with reference to FIG. 4. Now, suppose that a three-layer structure in which a layer having a given refractive index is sandwiched between layers having a smaller refractive index is used. Calculating the distribution of the optical electric field in such a simplest optical waveguide by simulation gives not a Gaussian shape as shown in FIG. 4C but a shape bulging at a base as shown in FIG. 4A. FIG. 4B is a function applied to FIG. 4C so as to make FIG. 4A closer to the actual distribution of the optical electric field. Performing Fourier transform on the distribution of the optical electric field (FIG. 4A) thus obtained gives a shape of the FFP shown in FIG. 4D that bulges from middle to base as compared with the Gaussian shape. This means that an FFP shape in the three-layer structure differs from a Gaussian shape.

Figure 5:
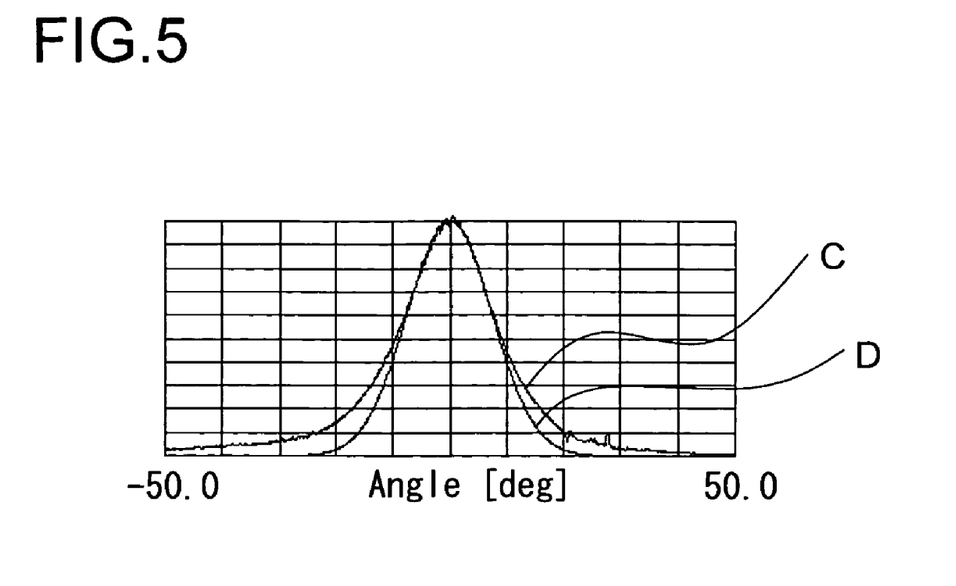
FIG. 5 is a diagram showing the measured values of the FFP in the vertical direction of the conventional semiconductor laser device.

FIG. 5 shows the measured values of the FFP in the vertical direction of the conventional semiconductor laser device. Distribution C represents the measured values. Distribution D represents a Gaussian function that fits a set of points extracted from the measured values and observed at 65 percent or more of the peak intensity by using a least squares method, and, as the simulation result shown in FIG. 4D, has a shape bulging from middle to base as compared with a Gaussian shape.

The presence of the light shielding layer of the present invention makes the optical electric field distribution shown in FIG. 4A closer to the shape shown in FIG. 4C. Specifically, in the semiconductor laser device, forming a light shielding region makes it possible to reduce the strength of the optical electric field distribution at a base on one or both of the p and n sides. This makes it possible to prevent the shape of the FFP in the vertical direction from bulging from middle to base, making the FFP shape closer to the Gaussian shape.

Figure 6:
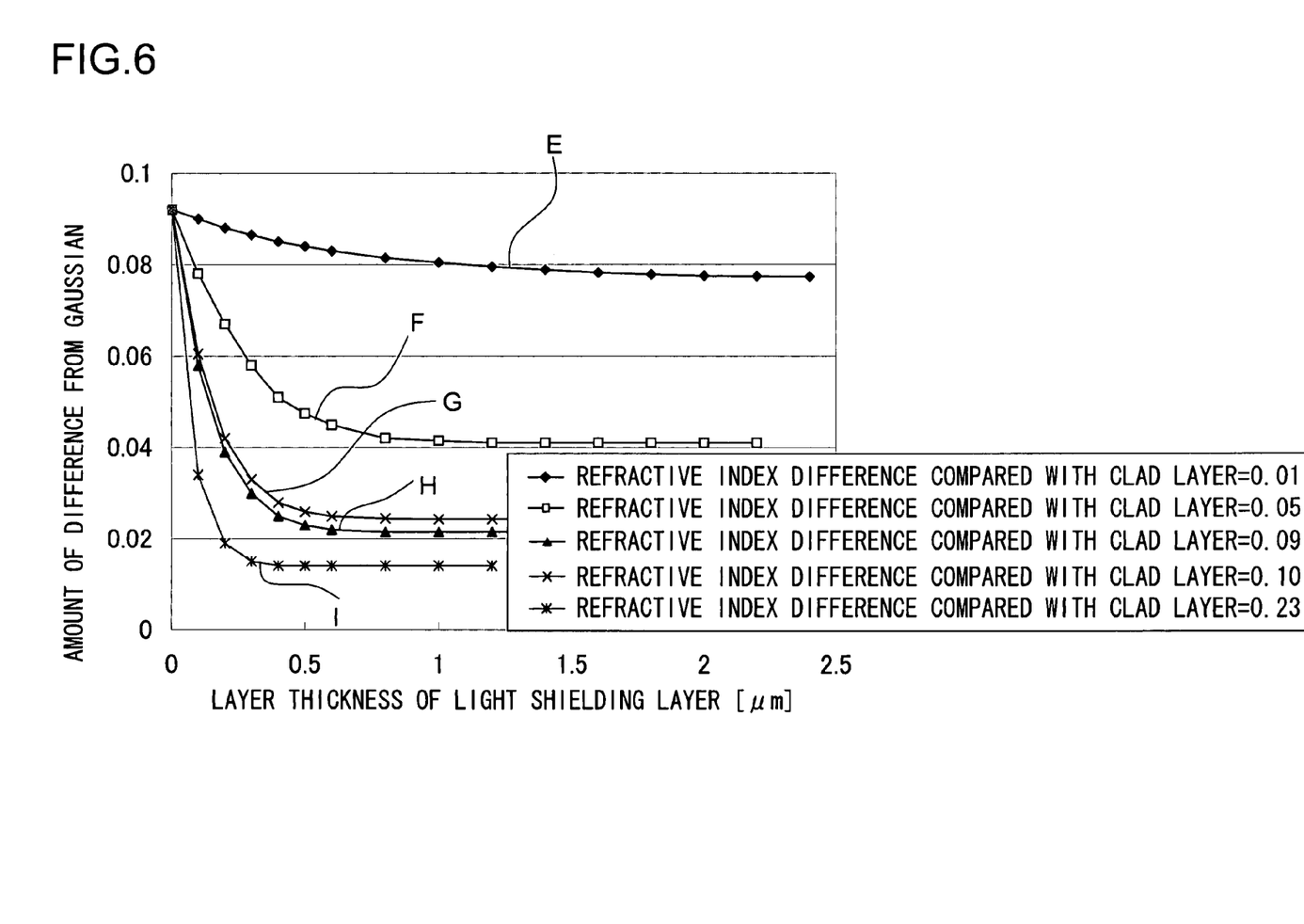
FIG. 6 shows the results of light distribution simulations under the assumption that a light shielding layer is inserted into the three-layer structure.

FIG. 6 shows the results of light distribution simulations under the assumption that a light shielding layer is inserted into the three-layer structure. The horizontal axis represents layer thickness, and the vertical axis represents the amount of difference from a Gaussian. Curves E, F, G, H, and I represent cases where differences in refractive index between a clad layer and a light shielding layer are 0.01, 0.02, 0.05, 0.09, and 0.23, respectively.

As shown in FIG. 6, when the difference in refractive index between a light shielding layer and a clad layer is 0.01 or more, the amount of difference from a Gaussian is reduced owing to the presence of the light shielding layer, and the greater the difference in refractive index, the greater the effect described above. Given that the refractive index of a nitride semiconductor is 2.55, the difference in refractive index is maximized when the light shielding layer is formed of air. Specifically, the difference in refractive index is 1.55 or less. Preferably, AlGaN with Al mixed crystal ratio of more than 0.1 is used so that the difference in refractive index is 0.05 or more. Further preferably, AlGaN with Al mixed crystal ratio of 0.2 or more is used so that the difference in refractive index is 0.09 or more. Further preferably, AlGaN with Al mixed crystal ratio of 1 is used so that the difference in refractive index is 0.23 or more.

Moreover, as shown in FIG. 6, when the layer thickness of the light shielding layer is at least 0.01 µm or more, the effect of the present invention occurs, and the thicker the light shielding layer, the greater the effect. The amount of difference from a Gaussian is made closer to a constant value over a particular layer thickness. Specifically, a layer thickness of 1.5 µm or less is sufficient to obtain the above effect. However, when a structure in which a light shielding layer of AlGaN is inserted into a clad layer is adopted, a too thick light shielding layer easily develops cracks in crystals due to different lattice constants of the crystals. This adversely affects the reliability of the semiconductor laser device. Therefore, the layer thickness is preferably 0.1 µm or more but 1.0 µm or less. Further preferably, the layer thickness is 0.3 µm or more but 0.8 µm or less.

In the present invention, the effect of the n-type light shielding layer 103 is pronounced when the optical refractive index of the n-type light shielding layer 103 is 0.01 or more smaller than that of the second n-type clad layer 104. Likewise, the effect of the p-type light shielding layer is pronounced when the optical refractive index of the p-type light shielding layer is 0.01 or more smaller than that of the p-type clad layer 110. The reason is as follows. Let the difference in refractive index between a conductivity-type clad layer and a light shielding layer be $\Delta n0$, and the coordinate in the layer thickness direction be x (the positive direction pointing toward the light shielding layer). Then, the light intensity is attenuated substantially proportionately with $\exp(-a \cdot \Delta n0 \cdot x)$ (where a is a constant), and attenuation becomes pronounced when $\Delta n0$ is 0.1. The optical refractive index of the n-type light shielding layer 103 is preferably 0.03 or more, further preferably 0.05 or more, still further preferably, 0.1 or more smaller than that of the second n-type clad layer 104.

Preferably, the distance between the n-type light shielding layer 103 and an active layer side principal surface of the second n-type clad layer 104 is 0.01 µm or more but 1.5 µm or less. Likewise, the distance between the p-type light shielding layer and an active layer side principal surface of the p-type clad layer 110 is preferably 0.01 µm or more but 1.5 µm or less. The lower limit of the above distance range is so defined as to prevent $\theta \perp$ from becoming too great, and the upper limit thereof is so defined as to keep the minimum distance required for the light shielding layer to produce the intended effect. The distance between the above two layers is preferably 0.2 µm or more but 1.0 µm or less, and further preferably 0.4 µm or more but 0.8 µm or less.

Preferably, the n-type light shielding layer 103 and the p-type light shielding layer are 0.01 µm or more in thickness so that they can produce the intended effect, and they are preferably 3 µm or less in thickness so that the growth thereof is possible.

Moreover, the n-type light shielding layer 103 and the p-type light shielding layer may be formed of an insulating material such as $SiO_2$, $ZrO_2$, $Al_2O_3$, or SiN, a semiconductor material such as $Al_xGa_{1-x}N(0<x\leq 1)$, $Al_yGa_{1-y}As(0<y\leq 1)$, or $Al_zGa_{1-z}P(0<z\leq 1)$, or a metal material, or formed as an air layer such as a void grown by ELOG.

Preferably, the optical absorption coefficient of the n-type light shielding layer 103 and the p-type light shielding layer is 10000 $cm^{-1}$ or more. The reason is as follows. Let the optical absorption coefficient of the light shielding layer be $\alpha$ [$cm^{-1}$], and the position in the layer thickness direction be x (the positive direction being the layer growth direction from the surface of the substrate). Then, the light intensity is attenuated exponentially by $\exp(+\alpha x)$ as light travels away from the active layer, and the greater the value of $\alpha$, the more pronounced attenuation. Attenuation begins to be pronounced beyond a threshold of 10000 $cm^{-1}$. This is the reason that the optical absorption coefficient of the n-type light shielding layer 103 and the p-type light shielding layer is preferably 10000 $cm^{-1}$ or more. Note that the above optical absorption coefficient is preferably 50000 $cm^{-1}$ or more, further preferably 100,000 $cm^{-1}$ or more, and still further preferably 500,000 $cm^{-1}$ or more.

Preferably, the difference in the Al mixed crystal ratio between the second n-type clad layer 104 and the p-type clad layer 110 is within 1%, because, when this requirement is met, the part from the n-type clad layer to the p-type clad layer is closely symmetric in terms of the refractive index distribution with respect to the central plane of the active layer. The reason that the limit value is set at 1% here is that the refractive index distribution can be regarded as symmetric.

Moreover, it is preferable that the vertical distribution of the optical refractive index from the n-type clad layer 104 to the p-type clad layer 110 be symmetric with respect to the active layer 107, because this makes smaller the amount of difference from a Gaussian. It is further preferable that the vertical distribution of the optical refractive index from the light shielding layer 103 to the positive electrode 112 be symmetric with respect to the active layer 107, because this makes smaller the amount of difference from a Gaussian.

Figure 7:
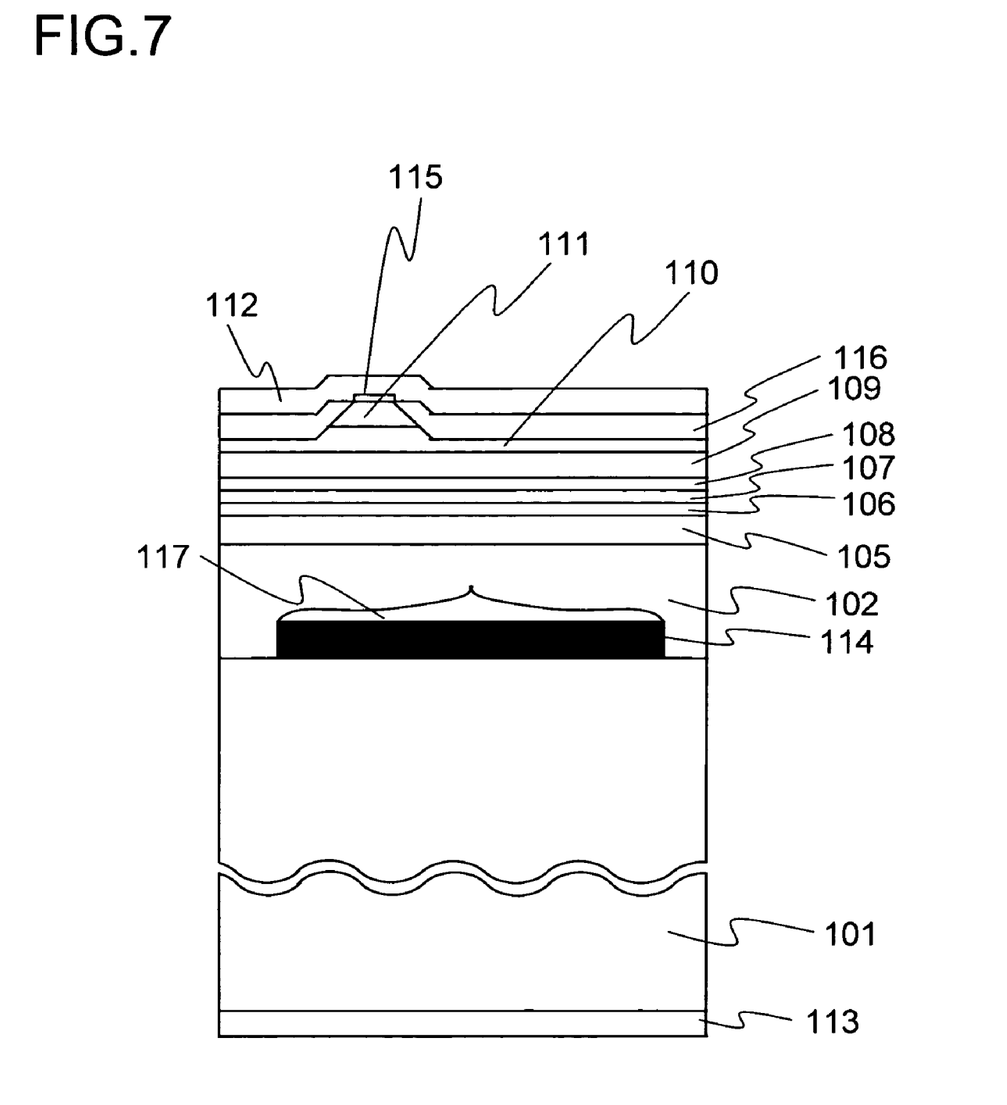
FIG. 7 is a schematic sectional diagram showing the structure of another example of the semiconductor laser device of the present invention.

FIG. 7 is a schematic sectional diagram showing the structure of another example of the semiconductor laser device of the present invention. This semiconductor laser device has the following layers laid one on top of another in the order mentioned on a GaN substrate 101: a mask layer 114 of an insulating material or a metal material, a first n-type clad layer 102 of n-type $Al_{0.061}GaN$, an n-type optical waveguide layer 105 of n-type GaN, a first carrier stop layer 106 of n-type $Al_{0.3}GaN$, a multiquantum well active layer 107 of InGaN/InGaN, a second carrier stop layer 108 of p-type $Al_{0.3}GaN$, a p-type optical waveguide layer 109 of p-type GaN, a p-type clad layer 110 of p-type $Al_{0.061}GaN$, a p-type contact layer 111 of p-type GaN, a p-type contact electrode 115, and a positive electrode 112. The p-type clad layer 110 and the p-type contact layer 111 are etched halfway through the p-type clad layer 110 so as to leave a stripe-shaped ridge portion. An insulating layer 116 for current constriction at the ridge portion is formed substantially all over the etched region. On the other hand, there is formed a negative electrode 113 on that surface of the GaN substrate 101 which is located opposite to where the first n-type clad layer 102 is formed. On top of the mask layer 114, a void 117 is formed.

In this device, the void 117 is formed as an air layer so as to serve as a light shielding region. Under some crystal growth conditions, however, there is a possibility that almost no void 117 is created. In that case, the mask layer 114 serves as a light shielding region. The mask layer 114 formed of an insulating material such as $SiO_2$, $ZrO_2$, $Al_2O_3$, or SiF serves as a light shielding region, because the difference in refractive index between the mask layer and the nitride semiconductor layer is 0.1 or more. The mask layer 114 formed of metal such as Ti, Ni, Pd, W, or Al serves as a light shielding region, because it is formed of a material having an absorption coefficient of 10000 $cm^{-1}$ or more.

Preferably, the distance between the light shielding region and a surface of the n-type clad layer 102 on the side of the active layer 107 is 0.01 µm or more but 1.5 µm or less. The lower limit of the above distance range is so defined as to prevent θ⊥ from becoming too great, and the upper limit thereof is so defined as to keep the minimum distance required for the light shielding region to produce the intended effect. The above distance is preferably 0.2 µm or more but 1.0 µm or less, and further preferably 0.4 µm or more but 0.8 µm or less.

Preferably, the light shielding region is 0.01 µm or more in thickness so that it can produce the intended effect, and it is preferably 3 µm or less in thickness so that the growth thereof is possible.

Moreover, it is preferable that the vertical distribution of the refractive index from the n-type light shielding region to the positive electrode 112 be symmetric with respect to the active layer 107, because this makes smaller the amount of difference from a Gaussian.

The semiconductor laser device of the present invention can be incorporated in an optical information recording apparatus that records, in an optical recording medium, information supplied in the form of an electric signal. This optical information recording apparatus is provided with: recording light emission control means that makes the semiconductor laser device emit recording laser light according to an electric signal; light condensing means that condenses the laser light emitted from the semiconductor laser device; and irradiation position control means that irradiates a predetermined position in the optical recording medium with the laser light condensed with the condensing means and records information.

The semiconductor laser device of the present invention can be used in an optical information recording apparatus that performs recording on an optical recording medium such as a CD or DVD.

What is claimed is:

1. A semiconductor laser device having a structure that confines light in a direction perpendicular to both a layer growth direction of a semiconductor layer and to a direction of a resonator, comprising:
    a first conductivity-type clad layer,
    an active layer,
    a second conductivity-type clad layer, and
    a light shielding layer
    laid in this order from a substrate side in the layer growth direction.

2. A semiconductor laser device having a structure that confines light in a direction perpendicular to both a layer growth direction of a semiconductor layer and to a direction of a resonator, comprising:
    a first light shielding layer,
    a first conductivity-type clad layer,
    an active layer,
    a second conductivity-type clad layer, and
    a second light shielding layer
    laid in this order from a substrate side in the layer growth direction.

3. The semiconductor laser device of claim 1,
    wherein the first conductivity-type clad layer and the second conductivity-type clad layer contain Al, and the active layer contains In.

4. The semiconductor laser device of claim 3,
    wherein a difference in Al mixed crystal ratio between the first conductivity-type clad layer and the second conductivity-type clad layer is within 1%.

5. The semiconductor laser device of claim 1,
    wherein an optical refractive index of the light shielding layer located to face a principal surface of the second conductivity-type clad layer different from an active layer side principal surface is 0.01 or more smaller than an optical refractive index of the second conductivity-type clad layer.

6. The semiconductor laser device of claim 1,
    wherein an optical absorption coefficient of the light shielding layer located to face a principal surface of the second conductivity-type clad layer different from an active layer side principal surface is 10000 $cm^{-1}$ or more.

7. The semiconductor laser device of claim 1,
    wherein a distance between the light shielding layer located to face a principal surface of the second conductivity-type clad layer different from an active layer side principal surface, and the active layer side principal surface of the second conductivity-type clad layer is 0.01 µm or more but 1.5 µm or less.

8. The semiconductor laser device of claim 1,
    wherein a layer thickness of the light shielding layer located to face a principal surface of the second conductivity-type clad layer different from an active layer side principal surface is 0.01 µm or more but 3 µm or less.

9. The semiconductor laser device of claim 1,
    wherein the light shielding layer located to face a principal surface of the second conductivity-type clad layer different from an active layer side principal surface is an insulating layer.

10. The semiconductor laser device of claim 1, wherein the light shielding layer located to face a principal surface of the second conductivity-type clad layer different from an active layer side principal surface is formed of one of $SiO_2$, $ZrO_2$, $Al_2O_3$, SiN, $Al_xGa_{1-x}N$ ($0<x\leq1$), $Al_yGa_{1-y}As$ ($0<y\leq1$), and $Al_zGa_{1-z}P$ ($0<z\leq1$).

11. The semiconductor laser device of claim 1, wherein the light shielding layer located to face a principal surface of the second conductivity-type clad layer different from an active layer side principal surface is a second conductivity-type electrode.

12. The semiconductor laser device of claim 1, wherein a first carrier stop layer containing Al is formed between the first conductivity-type clad layer and the active layer, and a second carrier stop layer containing Al is formed between the second conductivity-type clad layer and the active layer.

13. The semiconductor laser device of claim 1, wherein a part from the first conductivity-type clad layer to the second conductivity-type clad layer is symmetric in terms of a refractive index distribution with respect to a central plane of the active layer.

14. An optical information recording apparatus comprising the semiconductor laser device of claim 1.

* * * * *